United States Patent [19]

Sato et al.

[11] 4,370,025

[45] Jan. 25, 1983

[54] MULTICOLOR OPTICAL FILTER WITH A UNITED INTERFERENCE FILTER AND DYE FILTER AND PROCESS FOR MAKING THE SAME

[75] Inventors: Masamichi Sato; Kenji Matsumoto, both of Asaka; Kazuhisa Seki, Omiya, all of Japan

[73] Assignees: Fuji Photo Film Co., Ltd., Kanagawa; Fuji Photo Optical Co., Ltd., Saitama, both of Japan

[21] Appl. No.: 219,655

[22] Filed: Dec. 24, 1980

[30] Foreign Application Priority Data

Dec. 27, 1979 [JP] Japan .................................. 54-173836

[51] Int. Cl.³ .................. G02B 5/22; G02B 5/28; G03C 5/00; H01J 29/02
[52] U.S. Cl. ..................................... 350/166; 350/316; 350/317; 430/24; 430/7
[58] Field of Search ............... 350/166, 164, 316, 320, 350/317; 430/7, 24

[56] References Cited

U.S. PATENT DOCUMENTS

| 3,410,626 | 11/1968 | Magrath | 350/166 |
| 3,466,120 | 9/1969 | Herriott et al. | 350/320 |
| 3,858,977 | 1/1975 | Baird et al. | 350/166 |
| 4,029,394 | 6/1977 | Araki | 350/166 |
| 4,271,246 | 6/1981 | Sato et al. | 430/7 |

FOREIGN PATENT DOCUMENTS 54-1649  1/1979  Japan .................................. 350/166

*Primary Examiner*—Jon W. Henry
*Attorney, Agent, or Firm*—Sughrue, Mion, Zinn, Macpeak & Seas

[57] ABSTRACT

A multicolor optical filter for, e.g., color solid image pickup elements composed of an interference filter and a dye filter united with each other in such a manner that the filter surface of the interference filter faces the filter surface of the dye filter. The dye filter is preferably prepared by developing a silver halide emulsion layer on a transparent substrate with a color developer containing a color coupler.

5 Claims, 4 Drawing Figures

MULTICOLOR OPTICAL FILTER WITH A UNITED INTERFERENCE FILTER AND DYE FILTER AND PROCESS FOR MAKING THE SAME

BACKGROUND OF THE INVENTION

This invention relates to a multicolor optical filter, and more particularly to a multicolor optical filter comprising an interference filter and a dye filter. The invention further relates to a process for making the multicolor optical filter.

Multicolor striped or mosaic optical filters are used for color solid image pickup elements, etc., typified by a color image pickup tube (or camera tube), a color charge coupled device (CCD), and a charge injection device (CID). A multicolor optical fiber usually comprises a regularly arranged stripe or mosaic pattern of red, green, and blue colors or cyan, magenta, and yellow colors. The color constitution of a multicolor optical filter is, however, not limited to the above-described three colors and other color arrangements such as two-color or four- or more-color arrangements are employed as the case may be.

Multicolor optical filters conventionally known are generally classified into interference filters and dye filters. An interference filter is composed of a transparent substrate such as a glass plate, etc., having formed thereon multilayer interference coatings for obtaining desired optical characteristics as described in Japanese Patent Publication Nos. 8590/'65; 27,742/'72; 23,247/'75; and 44,414/'75 and a dye filter is typically composed of a regularly arranged hydrophilic polymer layer dyed by dyes as described in Japanese Patent Application (OPI) Nos. 37,237/'72; 63,739/'73 and 66,853/'73, and Japanese Patent Publication No. 248/'78. An optical filter prepared by forming dye images in a silver halide emulsion layer by a coupler-in-developer type color development as will be described hereinafter belongs to the latter type.

Of these multicolor optical filters, an interference filter has particularly excellent optical characteristics but the step of making the filter of each color is very complicated and hence a multicolor optical filter obtained by repeating the complicated steps for two colors or three colors inevitably becomes expensive. On the other hand, the step of making a dye filter is simple as compared with the step of making an interference filter and, hence, a dye filter can be made at a relatively low cost. Furthermore, a multicolor optical filter can be obtained very easily by the process developed by some of the inventors hereof (as described in U.S. patent application Ser. No. 52,704, filed June 28, 1979 now U.S. Pat. No. 4,271,246) wherein a multicolor optical filter is prepared by light-exposing a black and white silver halide emulsion layer and developing it in a color developer containing a color coupler for each color and further according to this process, a pure black pattern called an optical black required for a multicolor optical filter for a color image pickup tube can be formed as a specific effect.

Consequently, the most preferred multicolor optical filter can be prepared by combining the advantage of an interference filter and the advantage of a dye filter.

Investigations in detail on dye filters along these multicolor optical filters have been made it has now been found that in comparing an interference type filter with a dye type filter, the dye type filter has inferior cyan or blue spectral characteristics.

FIG. 1 of the accompanying drawings shows a cyan spectral characteristic curve (A) of a typical interference filter and a cyan spectral characteristic curve (B) of a typical dye filter. A cyan dye filter has the disadvantages that the transmittance of the filter at the short wave length side (from 400 n.m. to 490 n.m.) and the long wave length side (from 500 n.m. to 600 n.m.) is lower than that of an interference filter and also fade-out of the cyan dye filter occurs. On the other hand, it has been found that the yellow spectral characteristics of a dye filter are the same as those of an interference filter.

Therefore, a stripe filter having good spectral characteristics can be obtained by combining a cyan interference filter and a yellow dye filter. Japanese Patent Publication No. 4129/'77 discloses the preparation of a one stripe filter uniting two sheets of stripe filters with each other but in this invention the same kind of interference filters are employed but the above-described technical idea of the advantage of an interference filter and the advantage of a dye filter when combined with each other is not disclosed.

SUMMARY OF THE INVENTION

An object of this invention is, therefore, to provide a multicolor optical filter having good spectral characteristics substantially the same as those of an interference filter.

Another object of this invention is to provide a multicolor optical filter having good spectral characteristics, which can be produced by a simple process in comparison with that for an interference filter and hence can be produced at a low cost.

Still another object of this invention is to provide a process for making the above-described multicolor optical filter.

It has now been discovered that the above-described objects of this invention are attained by the present invention.

That is, according to this invention, there is provided a multicolor optical filter comprising an interference filter composed of a transparent substrate having thereon regularly arranged interference layers with desired optical characteristics and a dye filter composed of a transparent substrate having a binder layer containing therein regularly arranged dye or dyes having different optical characteristics from those of the above-described interference filter, the interference filter being united with the dye filter in such a manner that the filter surface of the former faces the filter surface of the latter.

According to another embodiment of this invention, there is also provided a process for making a multicolor optical filter comprising the steps of uniting an interference filter composed of a transparent substrate having thereon regularly arranged interference layers with desired optical characteristics with a dye filter composed of a transparent substrate having a binder layer containing therein regularly arranged dye or dyes having different optical characteristics from those of the above-described interference filters in such a manner that the filter surface of the former faces the filter surface of the latter and abrading one of the transparent substrates of the filters to such a thickness that when a photoelectric transducer layer is formed on the abraded surface of the substrate, the fade-out (or decrease in resolving power due to separation of the filter layer and the photoelectric transducer layer) of the color separation image projected onto the surface of the photoelectric transducer layer is in an allowable range.

DETAILED DESCRIPTION OF THE INVENTION

Figure 1:
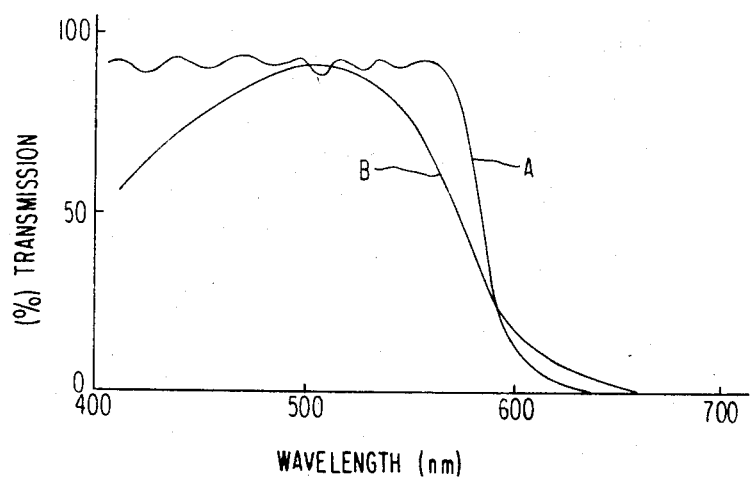
FIG. 1 is a graph showing the typical cyan spectral characteristic curve of an interference filter and the typical cyan characteristic curve of a dye filter.
Figure 2:
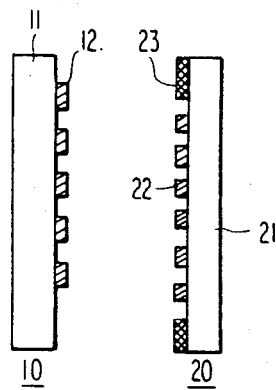
FIG. 2 is a schematic sectional view showing an embodiment of the filters used for the multicolor optical filter of this invention.
Figure 3:
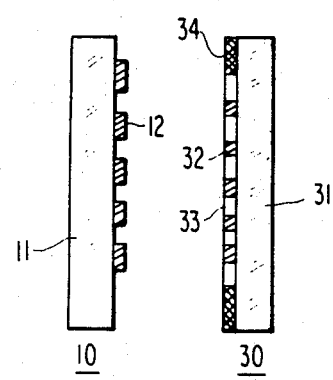
FIG. 3 is a schematic sectional view showing another embodiment of the filters for the multicolor optical filter of this invention.
Figure 4:
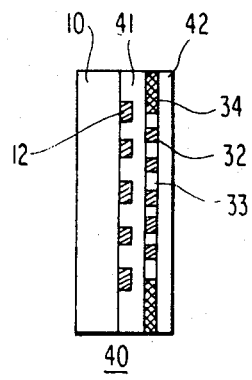
FIG. 4 is a schematic sectional view showing an embodiment of the multicolor optical filter of this invention.

First, the multicolor optical filter of this invention is further described in detail by referring to FIG. 2 to FIG. 4 of the accompanying drawings.

FIG. 2 shows an embodiment of filters used for this multicolor optical filter of this invention. In the figure an interference filter 10 is composed of a glass support 11 having formed thereon a cyan interference stripe pattern 12 and a dye filter 20 is composed of a glass support 21 having formed thereon a yellow stripe filter 22 composed of a hydrophilic polymer stripe dyed by a dye and an optical black 23 such as a vapor deposited layer of chromium.

FIG. 3 shows another embodiment of filters used for the multicolor optical filter of this invention. In the figure an interference filter 10 is composed of a glass support 11 and a cyan interference stripe pattern 12 as in FIG. 2 and a dye filter 30 is composed of a glass support 31 having formed thereon a yellow stripe filter 32 prepared by developing a silver halide emulsion layer with a coupler-containing color developer and an optical black 34. A transparent emulsion layer 33 is also formed on the glass support.

FIG. 4 shows an embodiment of a multicolor optical filter 40 of this invention prepared by uniting the two filters shown in FIG. 3 using a transparent adhesive 41 such as an epoxy adhesive and abrading the glass support 31 to a thin thickness 42.

Supports 11, 21 and 31 used in this invention are transparent and they may be in the form of plates, sheets, or films. Examples of suitable materials which can be used for these supports are synthetic resins such as polyethylene terephthalate, polystyrene, polycarbonate, cellulose acetate, etc., as well as glass, quartz, sapphire, etc. Also, the support itself may be used for other purposes. For example, the surface of one of the supports, e.g., the support 11, may be the surface of an image pickup tube.

The production of the interference filter 10 and the dyeing type dye filter 20 used in this invention as well as the formation of the optical black 23 used in this invention may be performed by using known processes as described before. By these processes, for example, the filter 12 having cyan spectral characteristics is formed in the interference filter 10 and also the filter 20 having yellow spectral characteristics is formed in the dye filter 20. As a matter of course, the interference filter 10 and/or the dye filter 20 may be a filter with two or more colors having different spectral characteristics.

The dye filter 30 prepared by a coupler-in-developer type color developing process as shown in FIG. 3 is explained below. One of the particularly preferred embodiments of this invention is use of the dye filter formed by a coupler-in-developer type color developing process as one of the filters of the multicolor optical filter of this invention. This is explained in detail below.

As a material for forming such a filter 30, a known photographic material composed of a support as described above having formed thereon directly or through a subbing layer a silver halide emulsion layer. In this case a fine grain type silver halide emulsion is preferred in this invention and, for example, a so-called Lipmann silver halide emulsion in which the mean grain size of the silver halide is smaller than 0.1 $\mu$m is particularly preferred. Examples of suitable silver halide emulsions which can be used are described in U.S. patent application Ser. Nos. 666,996, filed Mar. 15, 1976 and 788,945, filed Apr. 19, 1977.

The photographic material is image-wise-exposed through a photomask in a pattern corresponding to the first color of the multicolor optical filter, e.g., a yellow stripe or mosaic pattern. The light source used for the light exposure may be one emitting light of a wave length to which the silver halide emulsion layer is sensitive and, for example, a light source emitting white light can be used.

The photographic material thus exposed is then developed using a first color developer containing a coupler. For example, if the photographic material is developed by a color developer containing a yellow coupler, a pattern composed of a yellow dye and silver grains is formed at the exposed patterns. After finishing the first development, the silver grains of the pattern in the photographic material are bleached. For bleaching silver grains, a bleach solution which satisfies, in particular, the factors that it destroys latent images, it does not dissolve silver halide at the unexposed portions, and it does not destroy dyes, among reducers and bleach solutions known in the field of photography, such as an aqueous solution of an alkali metal dichromate or an ammonium salt and sulfuric acid, or an aqueous solution of a ferricyanide and potassium bromide can be used. As the results thereof, the latent image of the pattern of the first color, for example, the silver grains formed by the color development and undeveloped silver nuclei are dissolved off, or these silver grains or nuclei are rehalogenated, whereby development centers does not exist in the pattern of the first color. Therefore, if an imagewise exposure is not employed again to such a pattern, no color mixing occurs in the color development step or the steps for the second color or for colors after the second color, which are performed as the occasion demands, or in the development step for the optical black which is explained hereinafter. Suitable examples of developers, bleaching solutions and fixing solutions which can be used in the above processings are described in U.S. patent application Ser. No. 52,704, filed June 28, 1979.

In forming more than two colors, there is no color mixing in the pattern or patterns obtained by repeating the same steps as described above after performing the color development for the second color.

Then, the optical black 34 is formed after the formation of the dye pattern 32, e.g., yellow, etc., as shown in FIG. 3. The optical black may be previously formed on the support 31 by a photolithographic process, e.g., as disclosed in U.S. patent application Ser. Nos. 666,996, filed Mar. 15, 1976 now U.S. Pat. No. 4,284,713; 788,945, filed Apr. 19, 1977; and U.S. patent application Ser. No. 211,538 filed Nov. 26, 1980, but it is most effective to form the optical black in the following manner.

That is, after applying a pattern exposure for the optical black to the unexposed portions of a photographic material having formed therein a multicolor pattern by the same exposure process as that for each color, the photographic material is processed using a black and white development or a coupler-in-developer type color development and thereafter such is fixed, thereby silver halide in the unexposed portions and/or colored patterns is removed.

When the optical black is formed by a black and white development, the optical black is composed of silver and in this case it is difficult to obtain an optical density of higher than 4.0 but when the optical black is formed by a coupler-in-developer type color development, an optical density of higher than 4.0 can be easily obtained. Therefore, a particularly preferred embodiment in this invention is to form the optical black by a coupler-in-developer type color development.

When the optical black is formed by a black and white development, the optical density obtained is sometimes a little lower than 4.0 and the optical black may be used as it is but the optical density may be increased over 4.0 using known intensification techniques. Suitable processing techniques for forming the optical black are disclosed in U.S. patent application Ser. No. 211,538, filed Nov. 26, 1980.

The color filters shown in FIG. 2 or FIG. 3 thus formed are united with each other in such a manner that the filter surface of the one faces the filter surface of the other and, if necessary, the back side of one of the filter supports is abraded, e.g., using conventional techniques, to provide the completed multicolor optical filter as illustrated in FIG. 4.

When one of the supports for the multicolor optical filter obtained by the process of this invention is a glass disk for the face plate of an image pickup tube, the other support of the filter is abraded and may be used for the image pickup tube as it is. When both of these supports are polymer films or thin glass sheets (e.g., about 0.1–0.2 mm thick), after uniting the filters with each other using an optically transparent epoxy adhesive in such a manner that both filter surfaces face each other, the back surface of one of the supports is adhered to a glass disk using a similar adhesive and then the thickness of other support may be reduced by abrasion. The purpose of the abrasion is to reduce the thickness of the support to the extent that when a photoelectric transducer layer is formed on the surface of the abraded support, the fadeout of the color separation image projected onto the photoelectric transducer surface is in an allowable range. It is preferred for the thickness of the abraded support to be as thin as possible and the support is usually abraded to a thickness of about 10 to 100 μm.

As described above in detail, according to this invention, a multicolor optical filter having spectral characteristics substantially the same as those of an interference filter is obtained by a simpler production process than required for an interference filter and hence such can be obtained at a relatively low cost. This is because when a coupler-in-developer type color development system is employed, a dye pattern can be easily formed as well as the optical black can also be easily formed.

While the invention has been described in detail and with reference to specific embodiments thereof, it will be apparent to one skilled in the art that various changes and modifications can be made therein without departing from the spirit and scope thereof.

What is claimed is:

1. A multicolor optical filter comprising
an interference filter composed of a transparent substrate having thereon regularly arranged interference layers with desired optical characteristics and
a dye filter composed of a transparent substrate having a binder layer containing therein regularly arranged dye or dyes having different optical characteristics from those of said interference filter,
said interference filter being united with said dye filter in such a manner that the filter surface of the former faces the filter surface of the latter.

2. The multicolor optical filter as claimed in claim 1, wherein the dye filter comprises a regularly arranged hydrophilic polymer layer dyed by a dye or dyes.

3. The multicolor optical filter as claimed in claim 1, wherein the dye filter comprises dye images formed in a silver halide emulsion layer by a coupler-in-developer type color development process.

4. The multicolor optical filter as claimed in claim 1, wherein the interference filter has at least cyan spectral characteristics.

5. A process for making a multicolor optical filter comprising the steps of
uniting an interference filter composed of a transparent substrate having thereon regularly arranged interference layers with desired optical characteristics with a dye filter composed of a transparent substrate having a binder layer containing therein regularly arranged dye or dyes having different optical characteristics from those of said interference filter in such a manner that the filter surface of the former faces the filter surface of the latter and
abrading one of the transparent substrates of the filters to a thickness such that when a photoelectric transducer layer is formed on the abraded surface of the substrate, the fadeout of the color separation image projected onto the surface of the photoelectric transducer layer is in an allowable range.

* * * * *